United States Patent
Sauerwald et al.

(10) Patent No.: US 12,016,518 B2
(45) Date of Patent: Jun. 25, 2024

(54) ACCUMULATOR-OPERATED HOUSEHOLD APPLIANCE AND METHOD FOR OPERATING A HOUSEHOLD APPLIANCE

(71) Applicant: Vorwerk & Co. Interholding GmbH, Wuppertal (DE)

(72) Inventors: Andres Sauerwald, Bottrop (DE); Gerhard Isenberg, Cologne (DE); Dennis Huelsmann, Wetter (DE); Christoph Spitthoever, Wuppertal (DE)

(73) Assignee: Vorwerk & Co. Interholding GmbH, Wuppertal (DE)

( * ) Notice: Subject to any disclaimer, the term of this patent is extended or adjusted under 35 U.S.C. 154(b) by 0 days.

(21) Appl. No.: 16/059,253

(22) Filed: Aug. 9, 2018

(65) Prior Publication Data
US 2019/0045995 A1   Feb. 14, 2019

(30) Foreign Application Priority Data
Aug. 11, 2017   (DE) ...................... 10 2017 118 377.9

(51) Int. Cl.
*A47L 9/28* (2006.01)
*G01R 31/3842* (2019.01)
*H01M 10/48* (2006.01)

(52) U.S. Cl.
CPC .............. *A47L 9/2878* (2013.01); *A47L 9/28* (2013.01); *A47L 9/2842* (2013.01); *A47L 9/2857* (2013.01); *A47L 9/2868* (2013.01); *A47L 9/2884* (2013.01); *G01R 31/3842* (2019.01); *H01M 10/486* (2013.01)

(58) Field of Classification Search
CPC ........ A47L 9/2878; A47L 9/28; A47L 9/2842; A47L 9/2857; A47L 9/2868; A47L 9/2884; G01R 31/3842; H01M 10/486
See application file for complete search history.

(56) References Cited

U.S. PATENT DOCUMENTS

| 5,331,715 | A  | * | 7/1994  | Johnson  | A47L 5/30   |
|           |    |   |         |          | 15/323      |
| 6,324,339 | B1 | * | 11/2001 | Hudson   | H02J 7/0031 |
|           |    |   |         |          | 388/809     |
| 7,723,952 | B2 | * | 5/2010  | Phillips | B25F 5/00   |
|           |    |   |         |          | 320/112     |
| 2004/0179829 | A1 | * | 9/2004 | Phillips | H02P 29/02 |
|           |    |   |         |          | 388/804     |
| 2005/0278888 | A1 | * | 12/2005 | Reindle | A47L 9/2805 |
|           |    |   |         |          | 15/319      |

(Continued)

FOREIGN PATENT DOCUMENTS

| DE | 10 2012 112 403 A1 | 6/2014 |
| DE | 10 2015 100 339 A1 | 7/2016 |

*Primary Examiner* — Daniel Kessie
(74) *Attorney, Agent, or Firm* — Collard & Roe, P.C.

(57) ABSTRACT

An accumulator-operated household appliance and a method for the operation thereof, in which the household appliance has at least two electrical systems, wherein a first electrical system is a first coil of an electrical drive motor. Switches of a switching unit can be switched in such a way by means of a controller that every electrical system is either operated by means of an accumulator assigned thereto or that a plurality of electrical systems are operated by a joint accumulator.

8 Claims, 5 Drawing Sheets

(56) References Cited

U.S. PATENT DOCUMENTS

| | | | |
|---|---|---|---|
| 2007/0101536 A1* | 5/2007 | Nielsen | A47L 9/2857 15/351 |
| 2008/0022485 A1* | 1/2008 | Grey | A47L 11/4044 15/347 |
| 2008/0284363 A1* | 11/2008 | Lucas | A01D 34/78 318/441 |
| 2011/0197389 A1* | 8/2011 | Ota | H01M 50/20 429/121 |
| 2012/0159736 A1* | 6/2012 | Huber | H01M 10/6235 15/339 |
| 2015/0145444 A1* | 5/2015 | Reed | A47L 9/2878 15/412 |
| 2016/0036371 A1* | 2/2016 | Yamasaki | B62D 5/046 318/400.22 |
| 2016/0256027 A1* | 9/2016 | Chang | H02P 7/29 |
| 2018/0048173 A1* | 2/2018 | Kawano | B25F 5/02 |
| 2018/0076745 A1* | 3/2018 | Cox | H02P 6/14 |

* cited by examiner

ACCUMULATOR-OPERATED HOUSEHOLD APPLIANCE AND METHOD FOR OPERATING A HOUSEHOLD APPLIANCE

CROSS REFERENCE TO RELATED APPLICATIONS

Applicant claims priority under 35 U.S.C. § 119 of German Application No. 10 2017 118 377.9 filed on Aug. 11, 2017, the disclosure of which is incorporated by reference.

BACKGROUND OF THE INVENTION

1. Field of the Invention

The invention relates to a device in the form of an accumulator-operated appliance, in particular household appliance, for example cleaning appliance, such as vacuum cleaner, comprising at least two electrical systems, wherein a first electrical system is a first coil of an electrical drive motor, and wherein the electrical systems can be electrically connected to a first and a second accumulator by means of an electronic controller so as to transfer power.

The invention furthermore relates to a method for operating such an appliance.

2. Description of the Related Art

A floor or window cleaning appliance comprising an accumulator is described in DE 10 2012 112 403 A1.

DE 10 2015 100 339 A1 describes a drive motor-driven attachment appliance of a vacuum cleaner.

A plurality of different appliances, which are used in the household, which can be operated without a permanent power supply by being connected to a mains power supply, is known from the prior art. Accumulators are used as power source. To provide such an accumulator-operated appliance with a long operating time, an accumulator comprising a corresponding large capacity is required. If the capacity of the accumulator exceeds a certain threshold value, for example 100 Wh, the accumulator may only be transported in a corresponding dangerous goods class. This leads to additional costs and a higher effort.

The splitting of the power required to operate the appliance into several energy storages, for example a plurality of accumulators, is associated with circuit-related problems. A parallel connection of the accumulators is oftentimes only possible with large effort due to uneven accumulator voltage. A series connection of the accumulators increases the total voltage and leads to the problem that other motors need to be used or that certain power stages, at which the drive motor is operated, cannot be realized.

SUMMARY OF THE INVENTION

The invention is based on the object of specifying measures, by means of which an accumulator-operated appliance, which has two electrical systems, can be operated in a manner, which is advantageous for its use, by means of a plurality of accumulators.

The object is solved by means of the invention, which is specified in the claims.

An appliance according to the invention, for example a household appliance, in particular cleaning appliance, is equipped with at least two accumulators. Either every electrical system can be operated by means of an accumulator, which is assigned thereto in an electrically individual manner, with the controller, or a plurality of electrical systems are operated by a joint accumulator. A switching unit can be provided for this purpose, which has switches, by means of which the poles of the accumulators can be suitably connected to the poles of the electrical systems. The controller is preferably set up in such a way that functional parameters of the first and of the second accumulator can be detected. A functional parameter is in particular a value, which specifies, whether one of the plurality of accumulators is present, the height of the pole voltage of the accumulators, in particular the open-circuit voltage, the current temperature of the accumulator and/or a residual capacity of the accumulator. The apparatus according to the invention has a switching unit, by means of which each of the plurality of accumulators can be coupled to electrical systems to as to transfer power. The electrical systems are appliance-integrated consumers, which can be operated simultaneously or separately from one another. An electrical system is a coil of a drive motor. The drive motor has a plurality of coils, preferably two coils, wherein the individual coils can be energized separately from one another. The controller can set the switches of the switching unit as a function of the detected functional parameters in such a way that power is supplied to both electrical systems, thus for example two coils, by only one accumulator. Current is then supplied to both coils by the same accumulator. In an alternative operating position of the switching unit, the switches can be set in such a way that every electrical system is individually coupled to one of the plurality of accumulators, so that power is in each case supplied to the two electrical systems independently of one another by an accumulator. If the two systems are the coils of an electric motor, current is in each case supplied to the electric motors by another accumulator. Every accumulator thus forms a substantially independent source for an electrical current and an electrical voltage, wherein a voltage regulation is provided to regulate a supply voltage for operating one of the electrical systems. The regulation of the supply voltage can take place via a pulse width modulation. Every accumulator can individually supply power to a voltage supply. In the case of the method for operating the accumulator-operated appliance, a controller determines, for example with the help of suitable sensors, functional parameters, which are in each case assigned to one of the plurality of accumulators. If it is determined, for example, that two accumulators are present, that the accumulator voltage or the residual capacity, respectively, of the accumulator has a sufficient level or that the temperature is within an operational range, every electrical system is energized by an accumulator, independently of the other system. If more electrical systems than accumulators are present, two or a plurality of electrical systems are also supplied by a joint accumulator. If, in contrast, a functional parameter is determined, which suggests that only one accumulator is operational, for example because it is the only accumulator or because the other accumulator or the other accumulators do not have an operational operating state, a single accumulator is used to supply power to all electrical systems. The controller can possibly make arrangements here that the electrical systems only receive a reduced power. If the electrical appliance is for example a household vacuum cleaner, which has a drive motor, which can operate in different power stages, for example with a reduced power in the "eco mode" or with high power in the "boost mode", the appliance can only be brought into the boost mode, when it operates with two or a plurality of accumulators. In the preferred embodiment, power is then supplied to the at least two motor coils, which differ from one another, by the two accumulators, which differ from one another, wherein each accumulator is preferably assigned its own operating voltage regulation. If, in contrast, only one accumulator is operational, the electronic controller prevents that the drive motor can be operated with the highest power. It can then only be operated with a reduced power. The device according to the invention has a switching unit comprising at least three switches, wherein the switches are mechanical switches, but preferably semiconductor switches. The first or second accumulator, respectively, can be connected in the electrical circuit by means of a first and a second switch. This switch is located in the respective power supply circuit of the accumulator. A third switch preferably forms a bridge switch, which is open, when the first and the second switch are closed simultaneously, thus when the appliance is operated with two accumulators. The bridge switch is closed, when the appliance is operated with only one accumulator, thus for example when the first or the second switch is open. The three switches thus form a switching system, in which one switch is open and two switches are closed. It is provided that the appliance can have further electrical systems, thus electrical consumers, for example a second electric motor, which drives for example an attachment appliance of a vacuum cleaner. This second drive motor can also have two coils, which are separated from one another, which are in each case operated by one accumulator in response to an operation with a plurality of accumulators. It is also possible, however, that the second drive motor only has one coil, which can optionally be operated by one of the plurality of accumulators. For this purpose, it is possible, for example, by means of a multiplex circuit, to operate the second drive motor, dependent on the functional parameter, with a power, which is in each case supplied by a preferably single accumulator, but wherein different accumulators generate the power for the second drive motor in chronological order. In response to the chronological multiplexing, only that accumulator is selected for the additional load, which in each case supplies the highest residual capacity or the highest voltage, respectively, or which otherwise supplies the smallest current. The accumulator temperature can furthermore be another selection parameter.

BRIEF DESCRIPTION OF THE DRAWINGS

Exemplary embodiments of the invention will be described by means of enclosed drawings.

DETAILED DESCRIPTION OF THE PREFERRED EMBODIMENTS

Figure 1:
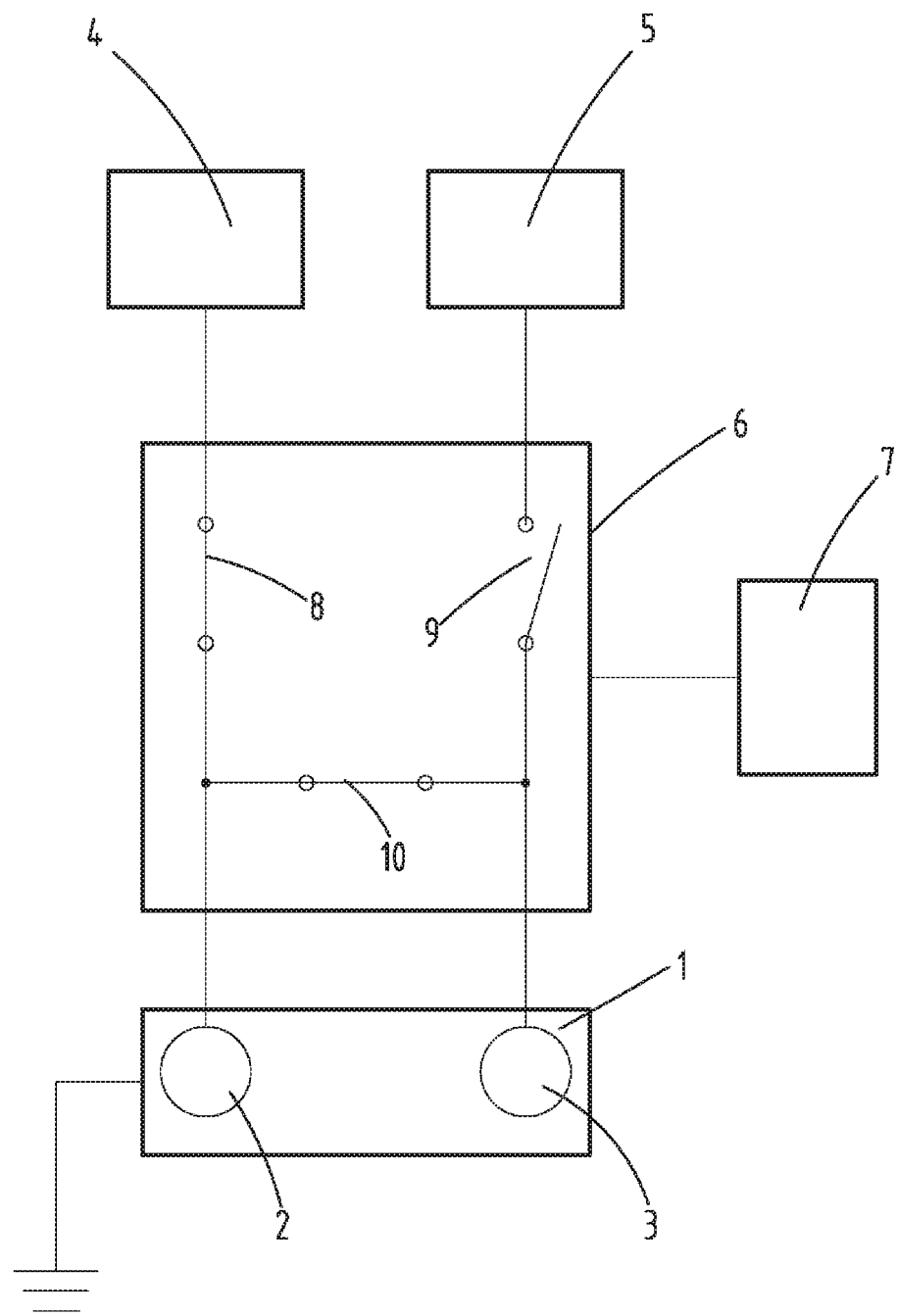
FIG. 1 shows, schematically, a circuit of a household appliance, which can be operated with two accumulators 4, 5, in a first operating state.

The appliance according to the invention is an electrical appliance comprising an electric motor, for example a vacuum cleaner, comprising a drive motor 1 for a fan. The power supply of the drive motor 1 takes place via a plurality of accumulators 4, 5, wherein only two accumulators 4, 5 are illustrated in the exemplary embodiment. By the use of a plurality of small accumulators, the appliance falls into a different dangerous goods class, than an appliance comprising a single accumulator of a larger capacity. The appliance according to the invention can thus be stored and transported with less effort.

In the case of a defect, only one of the plurality of accumulators 4, 5 needs to be replaced, wherein only a small accumulator 4, 5 needs to be replaced instead of a large accumulator.

The accumulators 4, 5 form an accumulator arrangement, which are connected to the coils 2, 3 of the drive motor 1 via an electrical conductive connection and switches 8, 9, 10 of a switching unit 6. A controller 7 is provided, by means of which the switches 8, 9, 10 can be brought from a blocking into a conductive state. The coils 2, 3 can be energized independently of one another, in order to rotationally drive the drive motor 1.

The power input of the drive motor 1 is carried out via an operating voltage supply, wherein a pulse width modulation of the voltage, which is supplied by the accumulator 4, 5, is provided for this purpose. The voltage regulating device can be provided upstream of the switches 8, 9, thus between accumulator 4 or 5, respectively, and switch 8, 9. However, the voltage regulation can also be arranged directly upstream of the coils 2, 3.

FIG. 1 shows an operating state, in which only the accumulator 4 is active. The accumulator 5 is either not present or does not have a function as a result of a residual capacity, which is too low. The switch 8, which is switched into the power supply circuit of the accumulator 4, is closed. The switch 9, which is located in the power supply circuit of the accumulator 5, is open. The two coils 2, 3 are operated by means of power provided by the accumulator 4 via the closed bridge switch 10.

Figure 2:
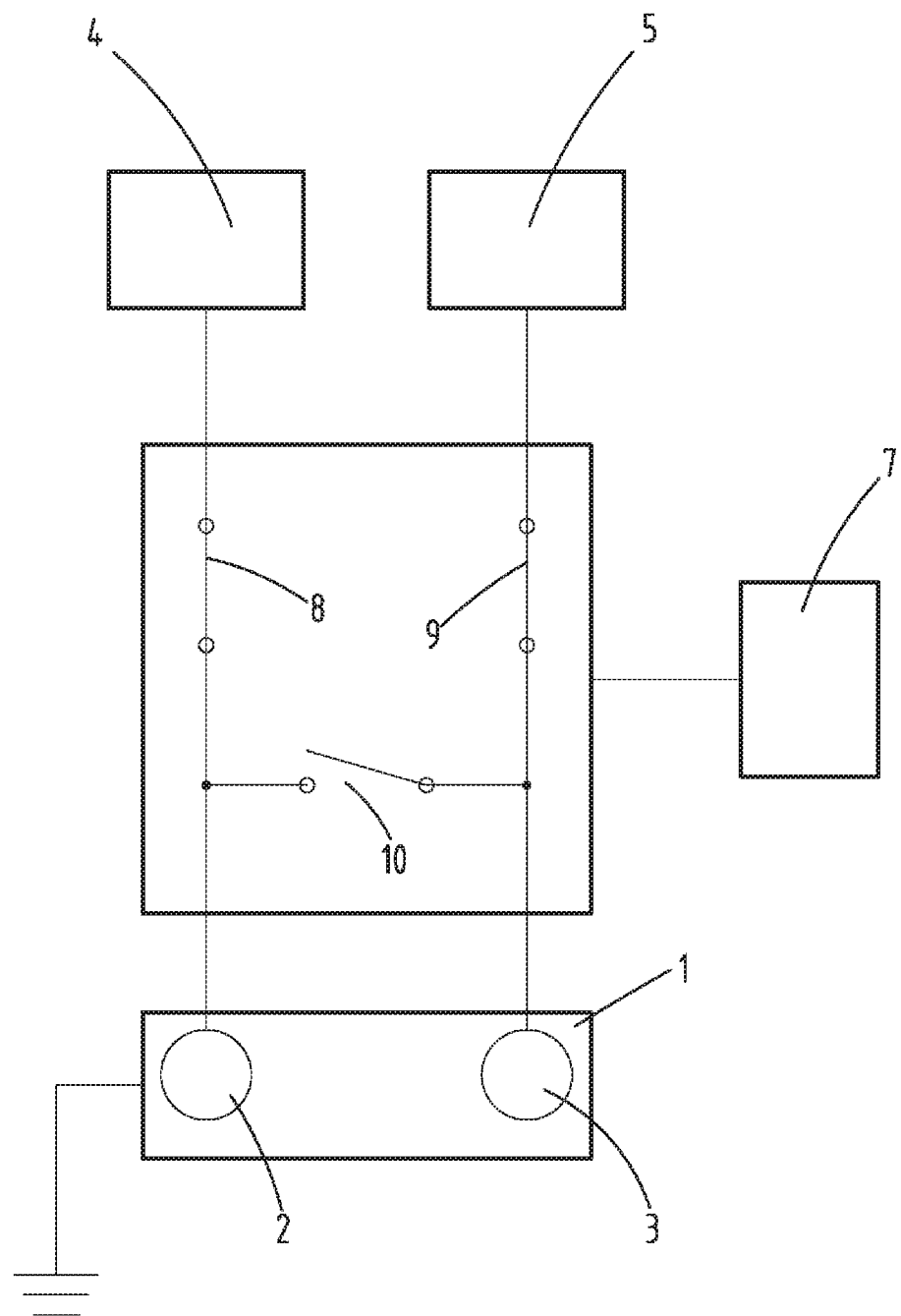
FIG. 2 shows the appliance illustrated in FIG. 1 in a second operating state.

FIG. 2 shows a different operating state, in which both accumulators 4, 5 are in an operational state. The power supply switches 8, 9 are closed. The bridge switch 10 is open, so that electrical power is supplied to every coil 2, 3 by an accumulator 4, 5 assigned thereto.

A third operating state corresponds analogously to the first operating state illustrated in FIG. 1, in the case of which the accumulator 4 is without function and the accumulator 5 is in an operational state. In contrast to the illustration in FIG. 1, the switch 8 is then open and the switch 9 is closed.

Figure 3:
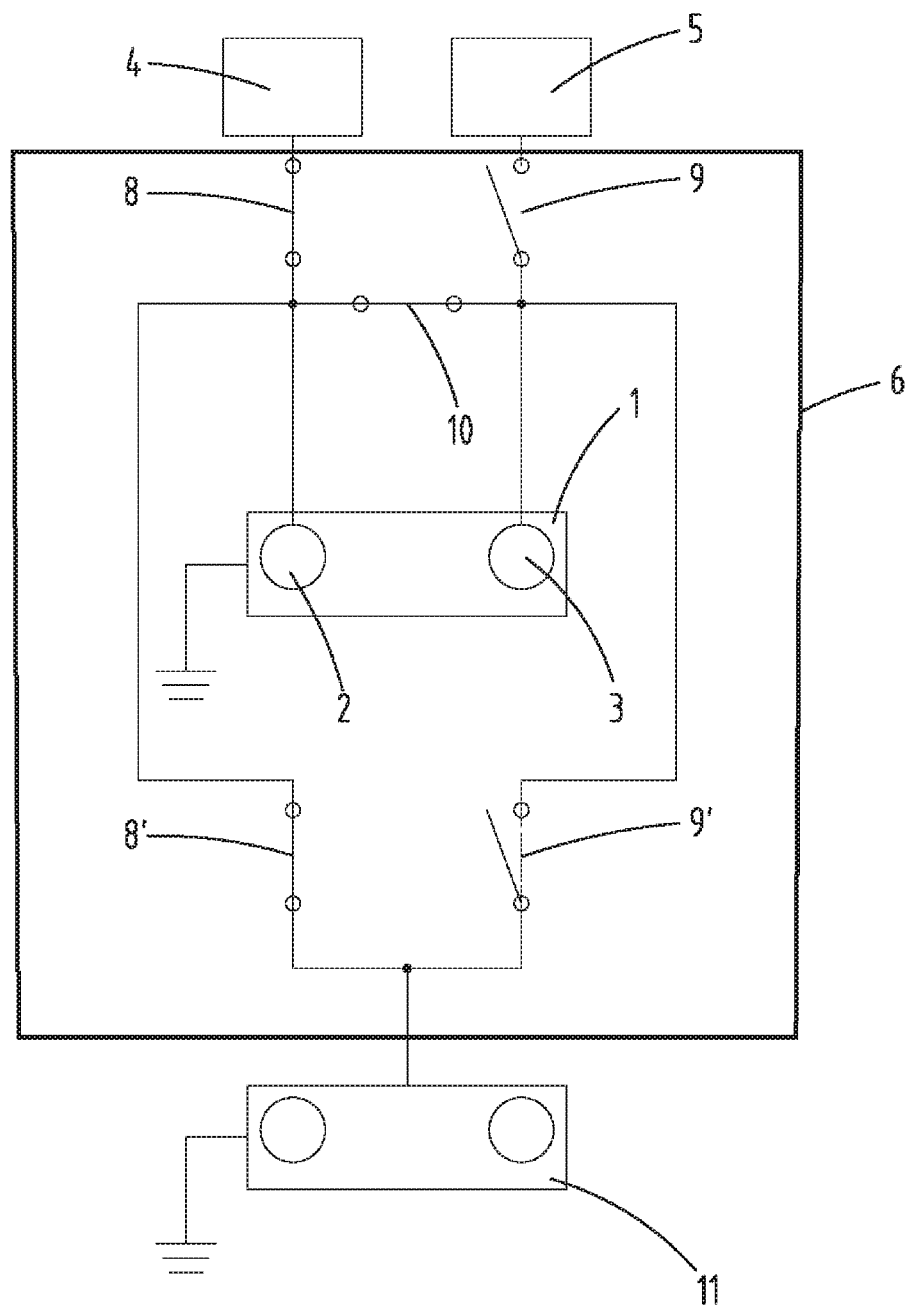
FIG. 3 shows an illustration according to FIG. 1 of a second exemplary embodiment in a first operating state.
Figure 4:
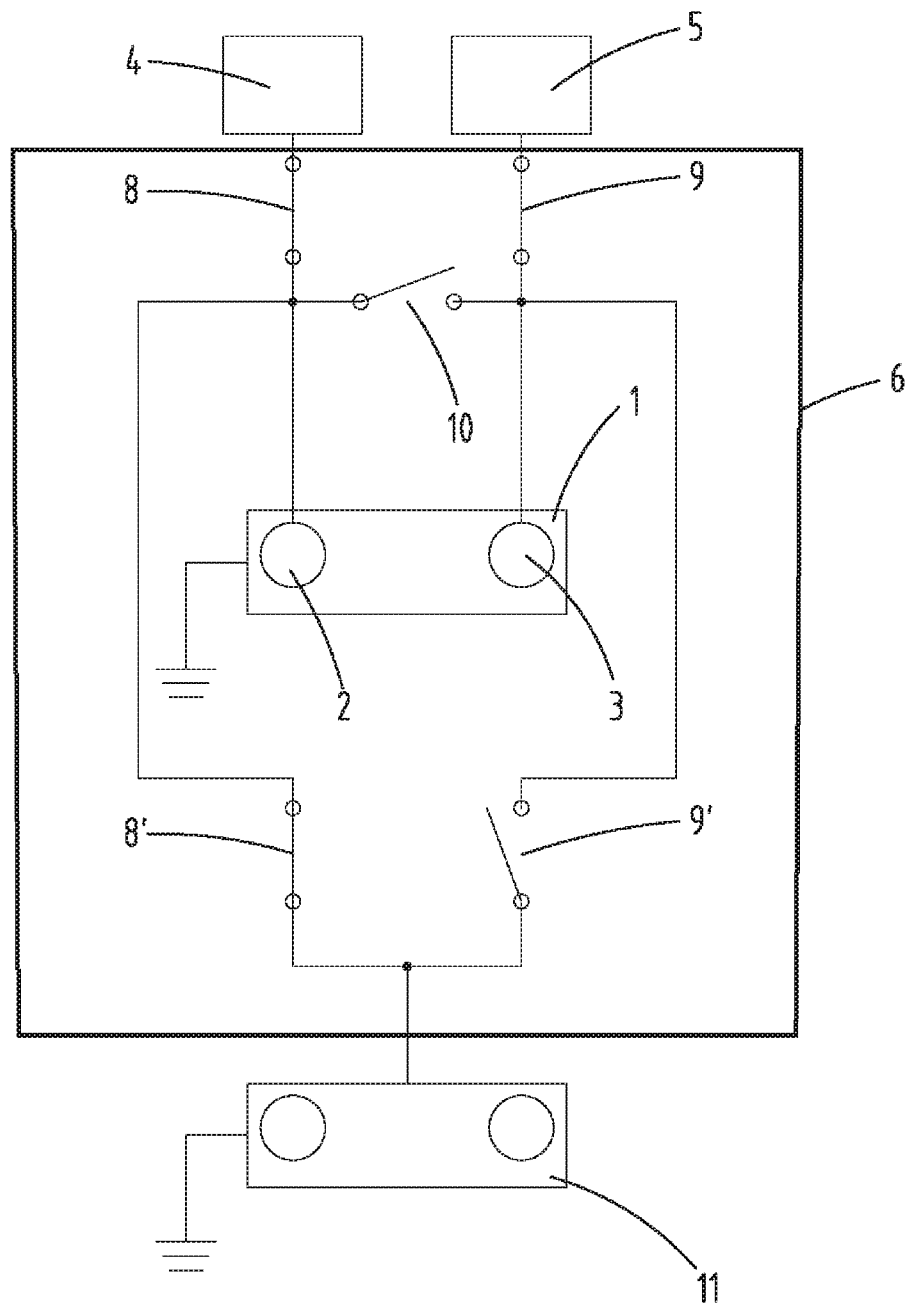
FIG. 4 shows an illustration according to FIG. 3 in a second operating state.

In the case of the exemplary embodiment illustrated in FIGS. 3 and 4, the household appliance, for example the vacuum cleaner, has an additional drive motor 11, by means of which for example an attachment appliance, as described in DE 10 2015 100 339 A1, is operated.

In the case of the operating state illustrated in FIG. 3, only the accumulator 4 is operational. The accumulator 5 is either not operational or is not present. The supply switch 8 is closed. The supply switch 9 is open. In that the bridge switch 10 is closed, the two coils 2, 3 are supplied with power by the accumulator 4. The second drive motor 11 is connected to the accumulator 4 by means of a switch 8', which is closed. It does not matter hereby, whether the switch 8', which connects the second drive motor 11 to the supply switch 8, or a switch 9', which connects the second drive motor 11 to the supply switch 9, is closed.

In the case of the operating state illustrated in FIG. 4, both accumulators 4, 5 are operational. The bridge switch 10 is open here. The coils 2, 3 of the electric motor 1 are supplied with power by different accumulators 4, 5. If the switch 8' is closed and the switch 9' is open, the first accumulator 4 supplies power to the second drive motor 11. If, in contrast, the switch 8' is open and the switch 9' is closed, the accumulator 5 supplies power to the second drive motor 11.

In the case of the operating state illustrated in FIG. 4, one of the switches 8', 9' is closed and one is open in each case.

In the case of the operating states illustrated in FIGS. 1 and 3, only one accumulator is available for the power supply of the two drive motors 1, 11, which is why it can be provided here that the controller 7 can operate the drive motors 1, 11 with only a reduced maximum power. In the operating states, as shown in FIGS. 2 and 4, however, it is possible that the controller 7 can also operate the drive motors 1, 11 with increased power.

Figure 5:
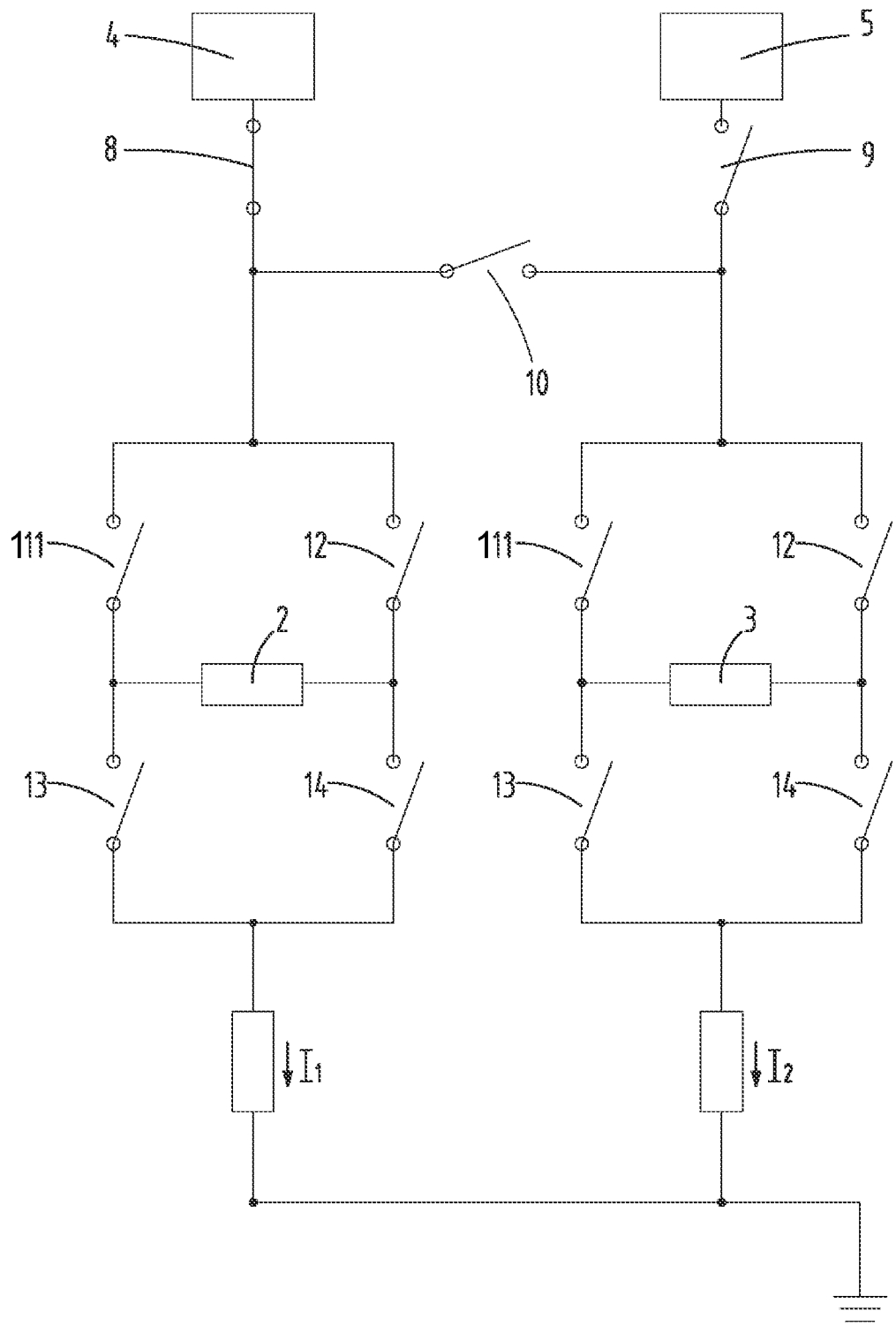
FIG. 5 shows a block diagram of a further exemplary embodiment.

With the switches 111, 12, 13, 14, FIG. 5 shows, schematically, a switch arrangement, wherein the switches can be operated by the controller 7 and are in particular semiconductor switches. The switches are operated in such a way that they supply a constant voltage level for both coils via a pulse width modulation. Regardless of the open-circuit voltage of the accumulators 4, 5, the voltage regulation ensures that the coils 2, 3 can be operated with identical voltage level.

Non-illustrated sensors are provided in order to measure the operating currents I1 and I2, which flow through the coils 2, 3. Sensors, by means of which the operating voltages applied to the coils 2, 3 can be measured, are further provided. Sensors, by means of which the temperature of the accumulators 4, 5 or the open-circuit voltages of the accumulators 4, 5 can be measured, are further provided.

In a non-illustrated further development of the invention, it is provided that the household appliance has three or more accumulators. The accumulators can in each case be accumulators with the same capacity. However, the accumulators can also have different capacities. The different capacities can be evenly divided to the total number of the consumers within the household appliance by means of a chronological multiplexing.

It is in particular provided that the number of the accumulators is at least as large as the number of the coils of the drive motor.

In the operating state illustrated in FIG. 4, the switch position of the switches 8', 9' can be changed in chronological order in response to a chronological multiplexing, so that the accumulator 4 as well as the accumulator 5 supplies power to the second drive motor 11 in chronological order.

LIST OF REFERENCE NUMERALS 1 drive motor
2 first coil
3 second coil
4 first accumulator
5 second accumulator
6 switching unit
7 controller
8 first switch
8' switch
9 second switch
9' switch
10 bridge switch
11 drive motor
12 switch
13 switch
14 switch
111 switch
I1 operating current
I2 operating current

What is claimed is:

1. A device in the form of an accumulator-operated appliance, comprising:
    at least two electrical systems, wherein a first one of the electrical systems is a first winding of a first electrical drive motor, and the second one of the electrical systems is a second winding of the first electrical drive motor,
    an attachment appliance,
    a first accumulator and a second accumulator, and
    an electronic controller configured for connecting the electrical systems to the first and second accumulators so as to transfer power,
    wherein the controller is set up to either connect both electrical systems to only one accumulator or to connect each electrical system to a separate accumulator,
    wherein the controller is configured to detect functional parameters of the accumulators and establish the electrical connections as a function of the functional parameters,
    wherein the functional parameters include information about the presence of an accumulator,
    wherein the controller is configured to automatically limit the power to the electrical systems so that the electrical systems only receive a reduced power, wherein the electrical drive motor is configured to operate in a first power mode and a second power mode with a higher power consumption compared to the first power mode, and wherein the controller is configured to automatically prevent the drive motor from being operated in the second power mode when only one accumulator is operational, and wherein the electronic controller allows the drive motor to be operated in the second power mode only when the appliance operates with at least two accumulators, and
    wherein the accumulator-operated appliance has a second electrical drive motor configured to operate the attachment appliance, wherein the accumulator-operated appliance has a multiplex circuit to operate the second electrical drive motor dependent on one of the functional parameters with power which is supplied by a single accumulator, but wherein different accumulators are configured in the multiplex circuit to separately supply the power to the second electrical drive motor one at a time in chronological order, wherein the accumulators are in parallel with each other and connected with the multiplexer, and wherein in response to the chronological multiplexing, only one of the accumulators is selected for an additional load, said one accumulator being the accumulator that in each case supplies a highest residual capacity or highest voltage, respectively, or which otherwise supplies the smallest current.

2. The device according to claim 1, further comprising a switch arrangement having electrical switches configured for connecting each one of the accumulators to an electrical system or for connecting a plurality of electrical systems to a single accumulator.

3. The device according to claim 1, wherein the functional parameters additionally include information about a pole voltage of the accumulator, a temperature of the accumulator and/or a residual capacity of the accumulator.

4. The device according to claim 1, comprising a supply voltage, which is obtained by pulse width modulation, for operating the electrical system.

5. The device according to claim 1, comprising a circuit that has a first switch arranged in an output circuit of the first accumulator, a second switch arranged in an output circuit of the second accumulator, and/or a bridge switch connecting the output circuits of the two accumulators to one another.

6. A method for operating an accumulator-operated appliance that has at least two electrical systems and an attachment appliance, wherein a first electrical system is a first winding of a first electrical drive motor, and a second one of the electrical systems is a second winding of the first electrical drive motor, comprising:
connecting the electrical systems to a first and/or a second accumulator by means of an electronic controller so as to transfer power,
wherein each winding is supplied with power by a separate one of the accumulators, or both windings are supplied with power by a single one of the accumulators,
wherein the controller detects functional parameters of the accumulators and establishes the electrical connections as a function of the functional parameters, and
wherein the functional parameters include information about the presence of an accumulator,
wherein the controller automatically limits the power to the electrical systems such that the electrical systems only receive a reduced power, wherein the electrical drive motor is configured to operate in a first power mode and in a second power mode that has a higher power consumption compared to the first power mode, and wherein the controller automatically prevents the drive motor from being operated in the second power mode when only one accumulator is operational, and wherein the controller allows the drive motor to be operated in the second power mode only when the appliance operates with at least two accumulators, and
wherein the accumulator-operated appliance has a second electrical drive motor configured to operate the attachment appliance, wherein the accumulator-operated appliance has a multiplex circuit to operate the second electrical drive motor dependent on the functional parameter with power which is supplied by a single accumulator, but wherein different accumulators are configured in the multiplex circuit to separately supply the power to the second electrical drive motor one at a time in chronological order, wherein the accumulators are in parallel with each other and connected with the multiplexer, and wherein in response to the chronological multiplexing, only one of the accumulators is selected for an additional load, said one accumulator being the accumulator that in each case supplies a highest residual capacity or highest voltage, respectively, or which otherwise supplies the smallest current.

7. The method according to claim 6, wherein the step of connecting takes place via a switch arrangement having electrical switches configured for connecting each one of the accumulators to an electrical system or for connecting a plurality of electrical systems to a single accumulator.

8. The method according to claim 6, wherein the functional parameters additionally include information about a pole voltage of the accumulator, a temperature of the accumulator and/or a residual capacity of the accumulator.

* * * * *